June 4, 1968 R. H. WINKLER 3,387,190

HIGH FREQUENCY POWER TRANSISTOR HAVING ELECTRODES FORMING TRANSMISSION LINES

Filed Aug. 19, 1965 3 Sheets-Sheet 1

INVENTOR.
RICHARD H. WINKLER

BY

Flehr and Swain

ATTORNEYS

INVENTOR.
RICHARD H. WINKLER
BY
Flehr and Swain
ATTORNEYS

INVENTOR.
RICHARD H. WINKLER

BY

Flehr and Swain
ATTORNEYS

United States Patent Office 3,387,190

Patented June 4, 1968

3,387,190

HIGH FREQUENCY POWER TRANSISTOR HAVING ELECTRODES FORMING TRANSMISSION LINES

Richard H. Winkler, Palo Alto, Calif., assignor to International Telephone and Telegraph Corporation, Nutley, N.J., a corporation of Maryland Filed Aug. 19, 1965, Ser. No. 480,870
7 Claims. (Cl. 317—234)

ABSTRACT OF THE DISCLOSURE

A high frequency transistor assembly in which the transistor die is mounted upon a dielectric wafer such that the collector electrode of the die is bonded to a metallic strip on the wafer, and the base electrode is electrically connected to another metallic strip on the wafer longitudinally aligned with the strip to which the collector electrode is bonded. The emitter and base electrodes face a ground plane so that the base strip forms an input transmission line with the ground plane and the collector strip forms an output transmission line with the ground plane. The emitter electrode is connected to a metallic bridge disposed above and spaced from the transistor die, so that the leads connecting the emitter electrode to the bridge form a shield which serves to isolate the input and output transmission lines. The ground plane is secured to the dielectric wafer and to the metallic bridge to ground the emitter electrode.

This invention relates generally to a transistor assembly and more particularly to a high frequency, high power transistor assembly.

As transistors are operated at higher frequencies, the distributed inductance and capacitance begin to play a significant role in the operation of the transistor. The result may be considerable drop-off, and even loss, of gain at the higher frequencies in the range of one-half to one kilomegacycle, and above. As the power handled by the transistor is increased, heat transfer away from the semiconductor body becomes increasingly important.

It is an object of the present invention to provide a transistor assembly having low distributed inductance in the transmission line common to the input and output circuits.

It is another object of the present invention to provide a transistor assembly having improved isolation between the input and output.

It is still a further object of the present invention to provide a transistor assembly which is simple in construction, and easy and inexpensive to manufacture.

It is a further object of the present invention to provide a transistor assembly suitable for connection in high frequency microwave circuits such as stripline and coaxial circuits.

It is still a further object of the present invention to provide a transistor assembly having improved heat transfer.

Generally, the transistor assembly of the present invention includes a transistor supported on a ceramic body which includes metallized lead portions. The body is, in turn, supported in good thermal contact on a header which faces the transistor and the metallized lead portions carried by the ceramic body. The header forms a ground plane which lies opposite to and spaced from the metallized leads to form therewith a transmission line for applying and removing high frequency power from said transistor.

The foregoing and other objects of the invention will become more clearly apparent from the following description taken in conjunction with the accompanying drawing.

Referring to the drawing.

Figure 11:
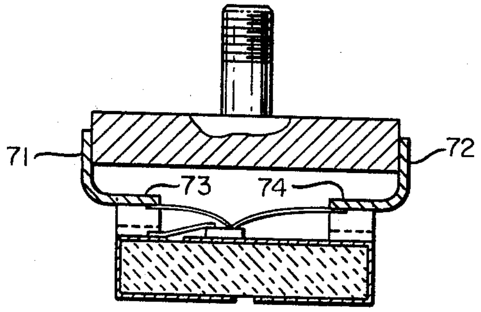
FIGURE 11 shows schematically an assembly including the prefab lead connector of FIGURE 10.
Figure 15:
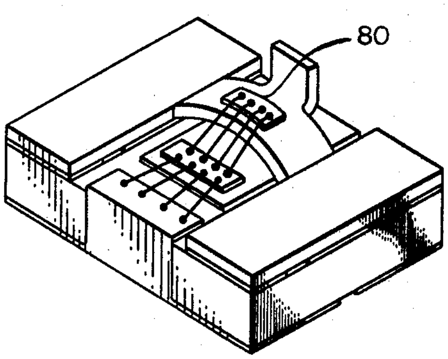
Figure 12:
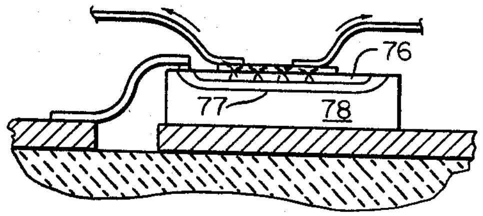
Figure 13:
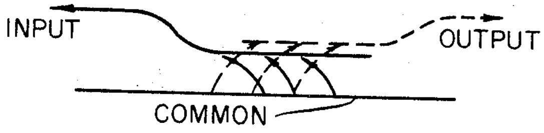
Figure 14:
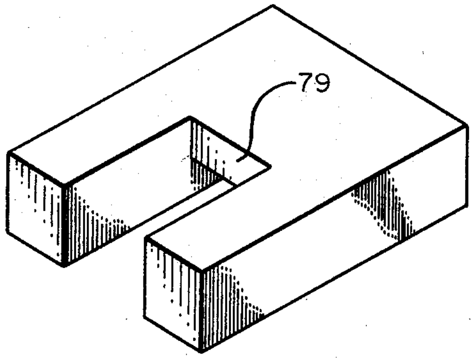

FIGURE 12 schematically shows the current flow in the transistor assembly of FIGURE 11;

FIGURE 13 is an enlarged view showing the current flow in the transistors of FIGURES 11 and 12;

FIGURE 14 shows another type of support block for use in a transistor assembly in accordance with the invention;

FIGURE 15 shows a transistor assembly including series emitter resistance; and

Figure 16:
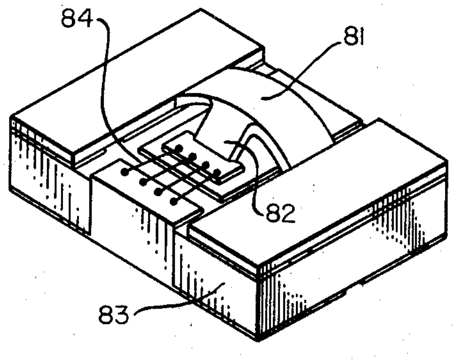

FIGURE 16 shows a transistor assembly in which the prefab lead connector is urged into pressure contact with the emitter region of the transistor supported on the ceramic body.

Figures 1, 2, 3, 4, 7:
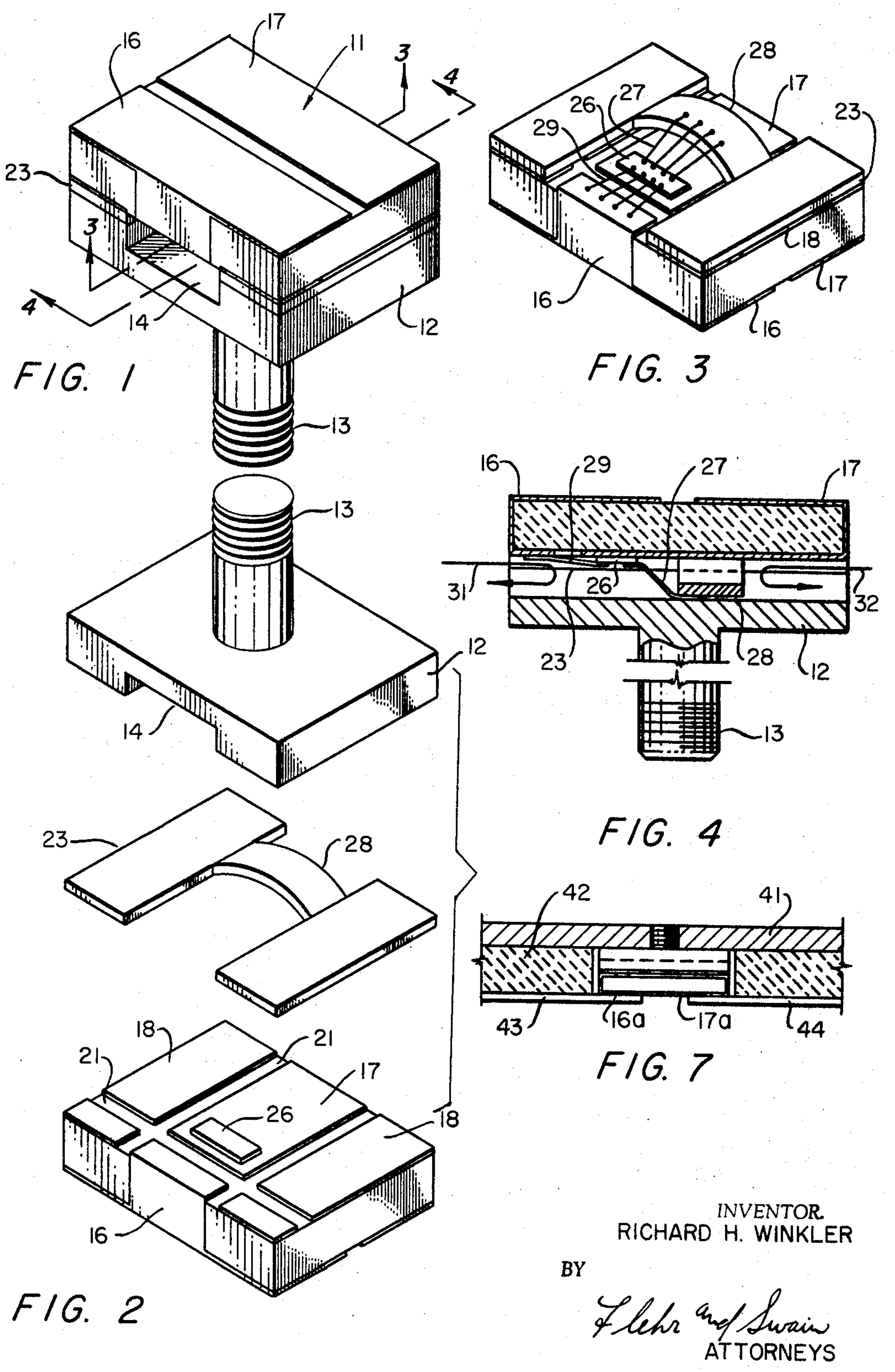
FIGURE 1 is a perspective view of a transistor assembly in accordance with the present invention.
FIGURE 2 is an exploded view of the assembly shown in FIGURE 1.
FIGURE 3 is a view taken generally along the line 3—3 of FIGURE 1.
FIGURE 4 is a sectional view taken along the line 4—4 of FIGURE 1.
FIGURE 7 shows a transistor assembly mounted in a stripline.

Referring to FIGURES 1 and 2, the transistor assembly includes a ceramic block 11 which is supported on metal support 12. The metal support 12 may include a stud 13 for mounting on the header of a conventional package, or directly on associated equipment, as will be presently described. The metal support 12 includes a channel 14 which, in cooperation with the ceramic block, forms a longitudinal tunnel.

The ceramic body 11 carries metallized areas such as base lead 16, collector lead 17 and emitter lead 18. The various metallized lead areas may, for example, be formed by metallizing the complete surface of the wafer and then cutting slots 21 to isolate the regions from each other. The metallized base lead extends over a portion of one face, around the edge of the ceramic block and provides a contact area on the opposite face of the ceramic block 11. The metallized collector lead extends over a portion of said one face, extends around the end of the device and provides a contact area on the opposite face of the ceramic block which lies between the spaced emitter leads 18. A preform 23 is sandwiched between the metal support 12 and the ceramic wafer 11 and may be soldered or otherwise bonded to the metallized emitter leads 18 and to the metal support to form electrical and heat conductive connection between the parts.

The assembly is pre-assembled, FIGURE 3, with the preform 23 mounted on the ceramic wafer and soldered to the emitter leads 18. Subsequently, a transistor die 26, which may include emitter, collector and base regions, is placed on the collector contact strip 17 and suitably soldered thereto whereby there is ohmic connection between the collector lead 17 and the collector.

Leads or wires 27 are connected between the emitter ohmic contact formed in the transistor and the bridge 28 of the preform 23. Similarly, leads or wires 29 extend between the base ohmic contact and adjacent portions of the metallized base lead 16.

It is seen that the preassembly may now be tested by mounting the ceramic block on a heat exchange surface and electrically testing the preassembly. If the preassembly is satisfactory, it is mounted on the metal support 12 to provide the assembly shown in FIGURE 1.

Referring more particularly to FIGURE 4, it is then seen that the assembly includes the transistor die 26 disposed in the tunnel with base wires 29 extending to the metallized base lead 16 and emitter wires 27 extending to the preform bridge 28. The metallized base lead 16 and collector lead 17 are spaced from the metal support 12 which is grounded to form the common terminal. The closely spaced wires 27, which extend between the emitter and the bridge, shield or mask off one side of the tunnel from the other side. This is especially true at high frequencies. The input current then flows along the metallized base lead, the base wire, and back along the emitter as shown generally by the arrow 31. The output current flows generally as shown by the arrow 32, that is, along the metallized collector lead and through the common emitter. Thus, the metal support forms the common or ground terminal.

Figures 5, 6, 8, 9, 10:
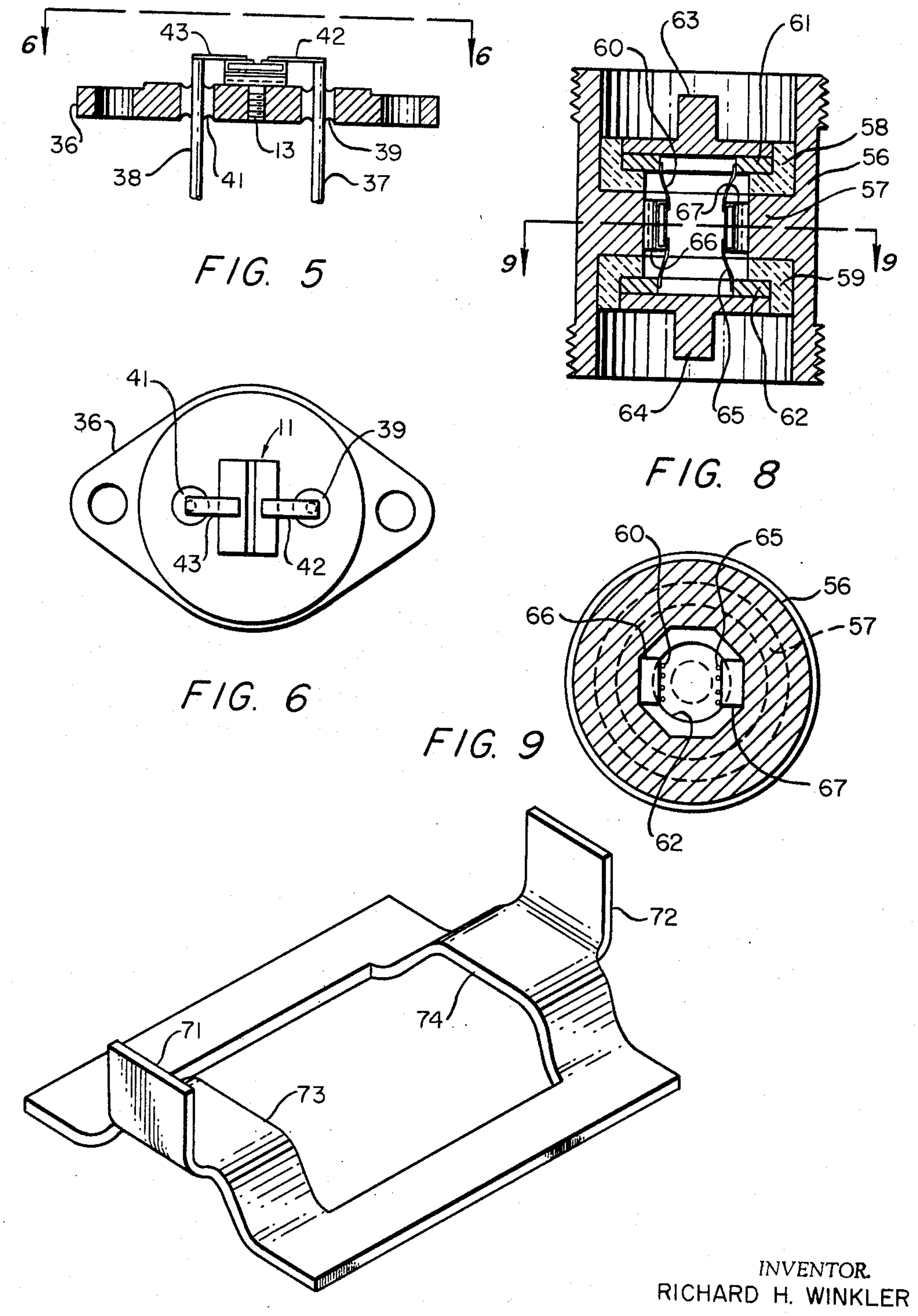
FIGURE 5 shows a transistor assembly in accordance with the invention mounted on a header.
FIGURE 6 is a view taken along the lines 6—6 of FIGURE 5.
FIGURE 8 shows a plurality of transistor assemblies mounted in a coaxial transmission line.
FIGURE 9 is a view taken along the line 9—9 of FIGURE 8.
FIGURE 10 shows another configuration for a lead connector.

An assembly of the foregoing character is secured to a header 36 of a conventional transistor package, FIGURES 5 and 6, as, for example, by threading. The header supports spaced leads 37 and 38 through glass beads 39 and 41, respectively. The upper ends of the leads 37 and 38 may be connected to strips 42 and 43, respectively. The strips 42 and 43 are soldered to the upper metallized leads carried by the ceramic wafer to make ohmic contact therewith. The complete assembly may then be encapsulated by applying a cover and suitably sealing the same in accordance with well-known techniques.

In summary, there is provided a transistor package in which the transistor die faces a ground plane and in which the common lead to the operating portions of the transistor is relatively short providing low common inductance between the output and input circuits. Further, the lead shields the input from the output. This permits maximum transfer of energy at high frequencies of operation.

An assembly of the foregoing character may easily be incorporated as an amplifier in a stripline. Referring particularly to FIGURE 7, there is shown a stripline having a ground plane 41 and a ceramic spacer 42 supporting the input and output lines 43 and 44, respectively.

A transistor assembly in accordance with the present invention is shown with the base lead **16*a* in contact with the input stripline 43, and the collector lead 17*a* in contact with stripline 44. The ground plane 41** is connected to the stud.

In essence then, there is incorporated in the transmission line a series amplifier. The input and output are isolated from one another as described above.

The configuration is also adaptable for mounting as a coaxial series amplifier. This arrangement is more clearly shown in FIGURES 8 and 9 wherein there is shown the outer conductor or ground plane 56 of a coaxial transmission line. The outer conductor is formed with a ridge 57 on opposite sides thereof which are mounted by insulating rings 58 and 59. The insulating rings carry copper washers 61 and 62 and central conductors 63 and 64. A transistor assembly of the type described is then mounted as shown at 66 and 67 with the metal support mounted directly to the outer conductor of the coaxial transmission line. The base of the transistors is connected to ring 61, while the collectors are connected to ring 62 by leads 63 and 64, respectively. Energy travelling downward through the line is amplified by the transistors connected in parallel, and the amplified output is available at the other end of the short section of transmission line.

The preform employed may take a shape such as shown in FIGURE 10 with upwardly extending ears 71 and 72 which can be used to ground the emitter currents from opposite ends of the connector. The preform of FIGURE 10 is adapted to be placed in an assembly such as shown in FIGURE 11 in which alternate emitter leads may extend to the bridges 73 and 74. An assembly of the type shown in FIGURE 11 will result in which there is an emitter lead assembly disposed in each direction. This tends to isolate the input and output currents as shown in FIGURES 12 and 13. In FIGURE 12 there is shown a transistor having emitter, base and collector regions 76, 77 and 78, respectively. It is seen that the input currents to the base, shown in solid arrows, and the output currents, shown in dotted arrows, travel in opposite directions to further reduce the mutual coupling.

In certain instances, the metal support may be shaped to eliminate the need for a preform. For example, the header may be shaped as shown in FIGURE 14 with one of the ends cut out in the form of a U. The emitter wires may, in this instance, be soldered directly between the front face 79 and the emitter connection on the transistor.

In FIGURE 15, there is shown an assembly of the type shown in FIGURE 3 in which there is interposed between the emitter wires and the preform bridge 28 a resistive film 80 to provide resistance in series with each of the wires for stabilizing the transistors in a manner described in copending application Ser. No. 437,960, filed Mar. 8, 1965 and assigned to the assignee of the instant application.

FIGURE 16 shows a preform which has a bridge 81 and a downwardly extending spring tab 82. When the preform is assembled to the ceramic support 83, the spring member 82 makes contact with the ohmic surface areas on the transistor and no soldering of wires is necessary to provide the ohmic path. The base leads or base tab may then be connected as shown at 84 to form the transistor assembly. The spring contact could also be carried by the header.

The assembly shown and described is in the so-called common emitter configuration. The base and collector leads are spaced from the common emitter lead and for input and output transmission lines.

It is apparent that the teaching of this invention can be applied to the so-called common base configuration. The invention is not intended to be limited in this respect.

Thus, it is seen that there is provided an improved transistor assembly capable of high frequency, high power operation.

I claim:

1. A high frequency power transistor assembly, comprising:
   - a dielectric wafer having upper and lower opposed major surfaces;
   - first and second spaced metallic areas on said upper surface;
   - first and second longitudinally aligned strips comprising spaced metallic films on said lower surface adjacent and electrically connected to respective ones of said first and second areas;
   - a die of semiconductor material having at least three active regions therein cooperating to provide a transistor element, said die including emitter and base electrodes disposed on one major face thereof and a collector electrode disposed on the opposite major face thereof, each of said electrodes being electrically connected to a corresponding one of said regions;
   - means for securing said opposite major face to a selected one of said aligned strips such that a joint of good electrical and thermal conductivity is formed between said collector electrode and said selected strip;
   - a terminal member comprising a metallic body having a pair of transversely spaced supporting legs bonded to said lower surface and straddling at least one of said aligned strips, said terminal member having a portion forming a bridge between said supporting legs, said bridge being spaced from the underlying part of said lower surface;

a first electrically conductive connection between said bridge and a selected one of said emitter and base electrodes;

a second electrically conductive connection between the other of said aligned strips and the other of said emitter and base electrodes; and a metallic plate secured to said terminal member, said plate having a surface forming a ground plane spaced from and substantially parallel to said aligned strips such that each of said first and second strips cooperates with said ground plane to provide first and second respective transmission lines for the transfer of energy at said high frequency, said selected electrode being electrically connected to said ground plane, such that said first conductive connection serves to provide isolation between said transmission lines.

2. A transistor according to claim 1, wherein said ground plane comprises a longitudinal groove in said plate such that said plate and said wafer cooperate to form a longitudinal tunnel housing said transmission lines.

3. A transistor according to claim 1, wherein said terminal member has an additional bridge portion spaced from said first mentioned bridge and the underlying part of said lower surface, further comprising an additional conductive connection between said selected electrode and said additional bridge, said selected electrode being situated at a point intermediate said bridges such that said first and additional conductive connections cooperate to provide improved isolation between said transmission lines.

4. A transistor according to claim 1, wherein said selected electrode is said emitter electrode.

5. A transistor according to claim 1, wherein said first conductive connection comprises a tab integral with said terminal member and extending downwardly from said bridge to said selected electrode.

6. A transistor according to claim 1, wherein said first conductive connection comprises a plurality of spaced leads.

7. A transistor according to claim 6, further comprising a resistive layer on said bridge, said leads being bonded to said resistive layer to introduce resistance in series with each of said leads to stabilize the operation of said transistor element.

References Cited

UNITED STATES PATENTS

| | | | |
|---|---|---|---|
| 3,021,461 | 2/1962 | Oakes et al. | 317—234 |
| 3,155,881 | 11/1964 | St. Jean | 317—234 |
| 3,244,939 | 4/1966 | Sandbank | 317—235 |
| 3,257,588 | 6/1966 | Mueller | 317—234 |
| 3,259,814 | 7/1966 | Green | 317—234 |
| 3,267,341 | 8/1966 | Evander | 317—234 |

FOREIGN PATENTS

| | | |
|---|---|---|
| 1,113,718 | 9/1961 | Germany. |

OTHER REFERENCES

Bell Lab. Record, "Microwave Transistor Mounts in Coaxial Shell," vol. 38, No. 4, p. 141, April 1960.

JOHN W. HUCKERT, *Primary Examiner.*

J. D. CRAIG, *Assistant Examiner.*